US011004658B2

United States Patent
Morimoto et al.

(10) Patent No.: US 11,004,658 B2
(45) Date of Patent: *May 11, 2021

(54) PLASMA PROCESSING APPARATUS AND PLASMA PROCESSING METHOD

(71) Applicant: Hitachi High-Technologies Corporation, Tokyo (JP)

(72) Inventors: Michikazu Morimoto, Tokyo (JP); Naoki Yasui, Tokyo (JP); Yasuo Ohgoshi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/050,089

(22) Filed: Jul. 31, 2018

(65) Prior Publication Data

US 2018/0337022 A1  Nov. 22, 2018

Related U.S. Application Data

(60) Continuation of application No. 15/132,701, filed on Apr. 19, 2016, now Pat. No. 10,192,718, which is a (Continued)

(30) Foreign Application Priority Data

Jun. 6, 2013 (JP) ................................. 2013-119396

(51) Int. Cl.
 *H01J 37/32* (2006.01)
 *H01L 21/3065* (2006.01)
 *H01L 21/67* (2006.01)

(52) U.S. Cl.
 CPC .... *H01J 37/32082* (2013.01); *H01J 37/3244* (2013.01); *H01J 37/32165* (2013.01);
 (Continued)

(58) Field of Classification Search
 USPC ...... 156/345.41–345.49; 118/723 E, 723 ER, 118/723 R, 723 MW, 723 ME, 723 MR,
 (Continued)

(56) References Cited

U.S. PATENT DOCUMENTS 5,733,820 A * 3/1998 Adachi .................. G01N 21/68
                                                         216/59
5,997,687 A  12/1999 Koshimizu
(Continued)

FOREIGN PATENT DOCUMENTS

JP   59-047733 A     3/1984
JP   2000150478   *  5/2000
(Continued)

OTHER PUBLICATIONS

English Machine Translation JP2000-150478, Kubota et al (Year: 2000).*

(Continued)

*Primary Examiner* — Rakesh K Dhingra
(74) *Attorney, Agent, or Firm* — Miles & Stockbridge, P.C.

(57) ABSTRACT

In a plasma processing apparatus including a first radio-frequency power supply which supplies first radio-frequency power for generating plasma in a vacuum chamber, a second radio-frequency power supply which supplies second radio-frequency power to a sample stage on which a sample is mounted, and a matching box for the second radio-frequency power supply, the matching box samples information for performing matching during a sampling effective period which is from a point of time after elapse of a prescribed time from a beginning of on-state of the time-modulated second radio-frequency power until an end of the on-state and maintains a matching state attained (Continued)

during the sampling effective period from after the end of the on-state until a next sampling effective period.

7 Claims, 14 Drawing Sheets

Related U.S. Application Data division of application No. 14/183,556, filed on Feb. 19, 2014, now Pat. No. 9,336,999.

(52) U.S. Cl.
CPC .. *H01J 37/32183* (2013.01); *H01J 37/32192* (2013.01); *H01J 2237/334* (2013.01); *H01L 21/3065* (2013.01); *H01L 21/67069* (2013.01)

(58) Field of Classification Search
USPC .................................................. 118/723 MA
See application file for complete search history.

(56) References Cited

U.S. PATENT DOCUMENTS

| 7,204,913 | B1 | 4/2007 | Singh et al. |
| 2005/0034811 | A1 | 2/2005 | Mahoney et al. |
| 2008/0110859 | A1 | 5/2008 | Koshiishi et al. |
| 2009/0255800 | A1 | 10/2009 | Koshimizu |
| 2009/0295296 | A1 | 12/2009 | Shannon et al. |
| 2009/0298287 | A1 | 12/2009 | Shannon et al. |
| 2010/0190350 | A1 | 7/2010 | Yatsuda et al. |
| 2010/0197137 | A1 | 8/2010 | Sumiya et al. |
| 2011/0226734 | A1 | 9/2011 | Sumiya et al. |
| 2013/0045604 | A1 | 2/2013 | Maeda et al. |
| 2014/0305905 | A1 | 10/2014 | Yamada et al. |

FOREIGN PATENT DOCUMENTS

| JP | M00-150478 A | 5/2000 |
| JP | 2003-532986 A | 11/2003 |
| JP | 2007-115860 A | 5/2007 |
| JP | 2009-033080 A | 2/2009 |
| JP | 2009-246091 A | 10/2009 |
| JP | 2010-171320 A | 8/2010 |
| TW | 2005-06388 A | 8/1993 |
| TW | 2010-29064 A | 8/2010 |
| TW | 2011-33605 A | 10/2011 |
| TW | 2013-08392 A | 2/2013 |

OTHER PUBLICATIONS

Office Action dated Mar. 17, 2017 for related Korean Application No. 10-2016-0004679.
Office Action dated Apr. 11, 2017 for related Japanese Patent Application No. 2013-119396.

* cited by examiner

FIG.12
CASE 1
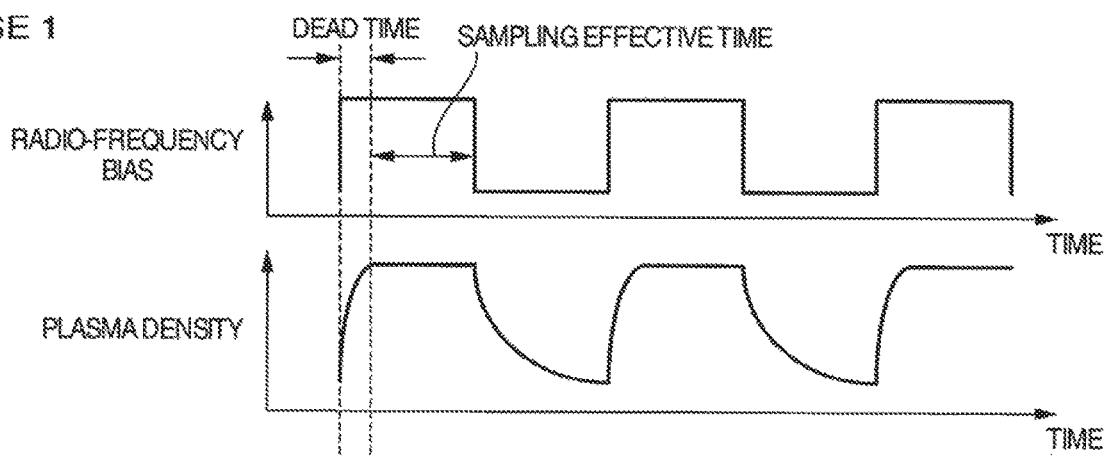
CASE 2
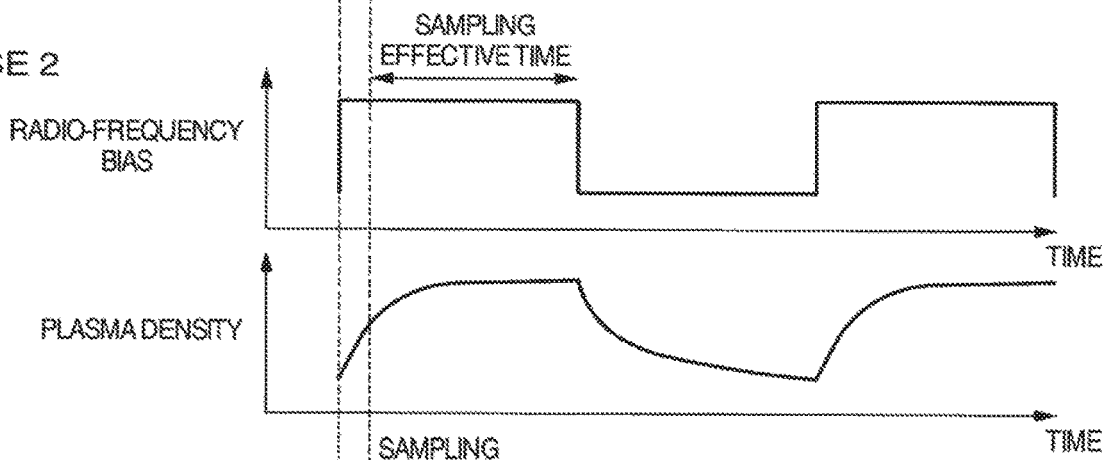
CASE 3
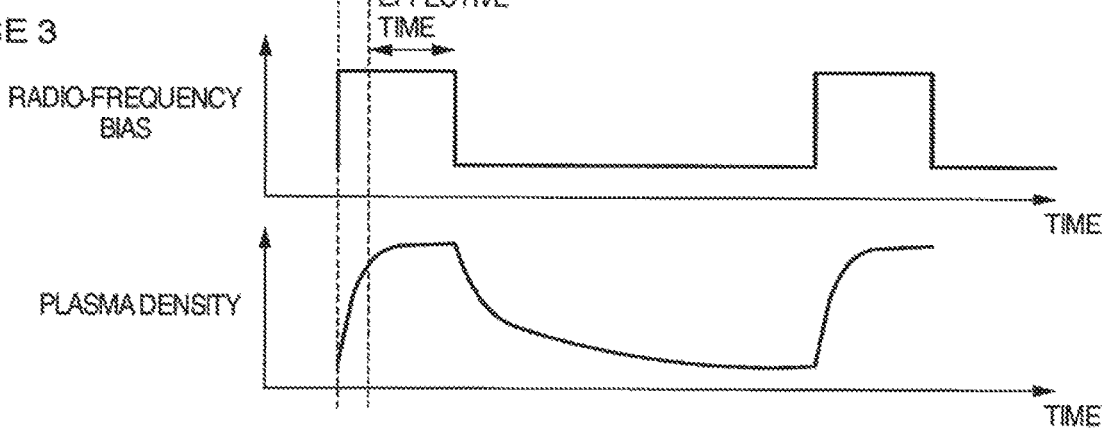

PLASMA PROCESSING APPARATUS AND PLASMA PROCESSING METHOD

BACKGROUND OF THE INVENTION

The present invention relates to a plasma processing apparatus and a plasma processing method and, more particularly, to a plasma processing apparatus and a plasma processing method appropriate to perform high-accuracy etching processing using plasma in order to process a sample such as a semiconductor device.

Heretofore, as a method of processing the surface of a semiconductor device, there is known an apparatus of etching the semiconductor device with plasma. A related art is described here by taking a plasma etching apparatus with an electron cyclotron resonance (hereinafter, abbreviated to ECR) scheme as an example.

In the ECR scheme, plasma is generated by a microwave in a vacuum chamber to which a magnetic field is externally applied. Electrons undergo cyclotron motion by the magnetic field and the frequency thereof and the frequency of the microwave can be resonated to generate the plasma efficiently. In order to accelerate ions impinging on the semiconductor device, radio-frequency electric power of a substantially sinusoidal continuous wave is applied to the sample. The radio-frequency electric power applied to the sample is hereinafter referred to as a radio-frequency bias. Further, description is made by taking a wafer as an example of the sample.

Furthermore, halogen gas of chlorine, fluorine, or the like is widely used as a gas which becomes plasma. Radicals and/or ions generated by the plasma react with material to be etched, thereby advancing etching. In order to control the etching processing with high accuracy, it is necessary to perform selection of species of the radicals and control of the amount of ions by plasma control. As a control method of radicals and ions, there is a pulsed plasma scheme in which plasma is time-modulated. The pulsed plasma controls dissociation by repeating on and off of the plasma to control the dissociation state of radicals and/or the ion density. By taking a repetition frequency of the on and off of the pulsed plasma (hereinafter, referred to as a pulse frequency), a ratio of on-time to one period of the repetition frequency (hereinafter, referred to as a duty ratio), and/or a ratio of on-time and off-time as control parameters, high-accuracy control of the etching processing becomes possible. JP-A-59-047733 discloses an etching processing control method using pulsed plasma.

FIG. 1 shows a case where a radio-frequency bias of a continuous wave is applied to pulsed plasma. The radio-frequency bias is applied even during off-time of plasma. Generally, since the plasma density is low during off-time of plasma, an impedance viewed from the radio-frequency bias is increased and an amplitude value of the voltage applied to the wafer (hereinafter, referred to as Vpp) becomes high. When the Vpp becomes high, ion irradiation energy is increased and there is a possibility that the wafer is damaged.

As a method of avoiding this damage, there is a method in which the radio-frequency bias is not applied during the off-time of plasma. FIG. 2 shows an example thereof. The radio-frequency bias is also time-modulated in the same manner as the pulsed plasma and repeats on and off in synchronism with the pulsed plasma, so that the damage to the wafer during the off-time of the plasma can be avoided.

SUMMARY OF THE INVENTION

In pulsed plasma of the ECR scheme using a microwave, the microwave for generating plasma is generally pulsed. As an example of the pulsing method of the microwave, there is a method of inputting a pulse signal which becomes a reference to a microwave power supply and outputting a microwave of a pulsed form by processing in the power supply. When plasma is formed with the microwave of a pulsed form, the plasma density changes as shown in FIG. 1. That is, the plasma density increases with on of the microwave unlike a continuous plasma method of the conventional ECR scheme, and it takes time to stabilize the plasma density.

Further, as a result of measurement of the reflectivity of the radio-frequency bias on the condition that the microwave output used in the generation of plasma is by a continuous wave output method (hereinafter, referred to as a CW mode) which is widely used heretofore and the radio-frequency bias is by a time-modulated output method (hereinafter, referred to as a pulse mode), the reflectivity is 5% or less of the radio-frequency bias output value as shown in FIG. 8. Incidentally, when the reflectivity is about 5% or less, the process performance is not influenced and there is no problem of damaging the power supply. Furthermore, the reflectivity (%) is calculated by multiplying a quotient obtained by dividing reflected power of the radio-frequency bias by output power of the radio-frequency bias by 100. On the other hand, in the pulsed plasma scheme, a transient time until stabilization of the plasma density exists every period and, when the radio-frequency bias synchronized with the pulsed plasma is applied, the plasma density changes due to repetition of on and off, thereby causing the plasma impedance as viewed from the radio-frequency bias to change and rendering matching difficult.

In this case, as shown in FIG. 2, there occurs a phenomenon that the reflected power becomes high and the reflection value is also unstable. When the reflected power value is large, there arises a problem that a difference between an actual applied power to a wafer and a set power value increases, so that high-accurate control cannot be performed. Also, since the reflected power returns to the power supply, the power supply may be damaged. When the reflected power value is not stabilized, the actual applied power to the wafer is not stabilized either. In this case, the etching processing result may also be unstable.

As a method of solving this problem, a method of applying the radio-frequency bias after the plasma density is stabilized as shown in FIG. 4 can be considered. In this method, since there exists a duration in which plasma is on in the period that the radio-frequency bias is not applied, depending on etching conditions, a problem may arise that compositions produced in plasma during the duration deposit on the surface of the wafer and the etching stop is caused.

In connection with the matching problem of the pulsed plasma scheme, JP-A-2003-532986 discloses a method of applying the radio-frequency bias while the output of the radio-frequency bias is changed gradually from a low level to a high level during the transient time when the plasma is switched over from off to on. Even in this method, however, since the radio-frequency bias is low during the transient time until stabilization of the plasma density depending on etching conditions similarly, there is a possibility that ion energy is insufficient and the etching stop due to byproduct deposit produced by the plasma in the transient time is caused. Matching becomes a large problem in the pulsed plasma scheme unlike the conventional plasma scheme.

Further, when the microwave output used to generate the plasma was set to the pulse mode and the radio-frequency bias was also set to the pulse mode as shown in FIG. 2 and the reflection value of the radio-frequency bias was measured, the reflectivity of the radio-frequency bias exceeded 5% and also the reflectivity was not stable. This is because the transient time exists in which it takes time until the plasma density is stabilized after the microwave output is turned on as shown in FIG. 2 in the scheme called pulsed plasma in which the generation of plasma is performed in the pulse mode. The cause that the reflection is not stabilized and is increased is described with reference to FIG. 7.

In a matching circuit, a current and a voltage are sampled to calculate the plasma impedance and matching is performed. Operation of variable capacitances is decided with the sampled plasma impedance. With the pulsed plasma, the transient time in which the plasma density is not stabilized is contained in the sampling unlike the plasma of the conventional continuous mode. The moment of A in FIG. 7 is in the transient time in which the plasma density is not stabilized. Plasma impedance in this time is greatly different from plasma impedances at other sampling moments B, C, D, and E of the plasma density.

At the moments B, C, and F, the plasma density is stable and the plasma impedances have close values. Accordingly, in the matching circuit, operation for bringing into the matching position of Za and matching operation to the impedances at the moments B, C, and F during the period of stable plasma density are mixed so that the matching operation cannot be executed normally and the matching circuit does not take optimum variable capacitance values, with the result that reflection is large and not stable.

In contrast, since the microwave output is off at the moments D and E and the plasma density is very low in this time as well as this time is short, influence on the etching performance is generally small. As for the radio-frequency bias, it is advantageous to perform matching during the period in which the plasma density is stable and the etching performance is greatly influenced.

When the pulsed plasma is used, it is necessary to consider change in the plasma density during the transient time unlike the convention scheme. A method in which the radio-frequency bias is not applied during the transient time as shown in FIG. 4 or a method of reducing the reflection value by slowly increasing the radio-frequency bias output can be considered. In this case, an ion acceleration voltage by the radio-frequency bias is reduced during the transient time. When deposition characteristics of plasma species are strong, deposits are formed on the surface of the sample and, accordingly, when the ion acceleration voltage is low, etching stop is caused, so that there is a possibility that the yield is reduced and/or the devices are defective.

In order to solve the above problems, with the present invention a plasma processing apparatus and a plasma processing method capable of stably supplying radio-frequency bias power are provided in a plasma processing apparatus and a plasma processing method in which radio-frequency power for plasma generation and radio-frequency bias power are time-modulated.

According to the present invention, in a plasma processing apparatus including: a vacuum chamber; a first radio-frequency power supply which supplies first radio-frequency power for generating plasma in the vacuum chamber; a sample stage disposed in the vacuum chamber on which a sample is mounted; a second radio-frequency power supply which supplies second radio-frequency power to the sample stage; and a matching box which suppresses reflected power of the second radio-frequency power, when the first radio-frequency power and the second radio-frequency power are time-modulated, control is performed so that the matching box samples information for performing matching during a sampling effective period which is from a point of time after elapse of a prescribed time from a beginning of on-state of the time-modulated second radio-frequency power until an end of the on-state of the time-modulated second radio-frequency power, and maintains a matching state attained during the sampling effective period from after the end of the on-state until a next sampling effective period.

Further, according to the present invention, in the plasma processing apparatus including: a vacuum chamber; a first radio-frequency power supply which supplies first radio-frequency power for generating plasma in the vacuum chamber; a sample stage disposed in the vacuum chamber on which a sample is mounted; a second radio-frequency power supply which supplies second radio-frequency power to the sample stage; and a matching box which suppresses reflected power of the second radio-frequency power, when the first radio-frequency power and the second radio-frequency power are time-modulated, control is performed so that the matching box samples information for performing matching during a sampling effective period which is a prescribed time period up to an end of on-state of the time-modulated second radio-frequency power, and maintains a matching state attained during the sampling effective period from after the end of the on-state until a next sampling effective period.

Furthermore, according to the present invention, in the plasma processing method using the plasma processing apparatus which includes: a vacuum chamber; a first radio-frequency power supply which supplies first radio-frequency power for generating plasma in the vacuum chamber; a sample stage disposed in the vacuum chamber on which a sample is mounted; a second radio-frequency power supply which supplies second radio-frequency power to the sample stage; and a matching box which suppresses reflected power of the second radio-frequency power, the first radio-frequency power and the second radio-frequency power are time-modulated; and matching of the matching box is performed as information for performing matching is sampled during a sampling effective period which is a prescribed time period up to an end of on-state of the time-modulated second radio-frequency power and a matching state attained during the sample effective period is maintained from after the end of the on-state until a next sampling effective period.

According to the present invention, in the plasma processing apparatus and the plasma processing method in which radio-frequency power for plasma generation and radio-frequency bias power are time-modulated, the radio-frequency bias power can be stably supplied.

Other objects, features, and advantages of the invention will become apparent from the following description of the embodiments of the invention taken in conjunction with the accompanying drawings.

BRIEF DESCRIPTION OF THE DRAWINGS

FIG. 12 is a diagram showing cases 1 to 3 when a dead time is fixed;

DESCRIPTION OF THE EMBODIMENTS

Figure 5:
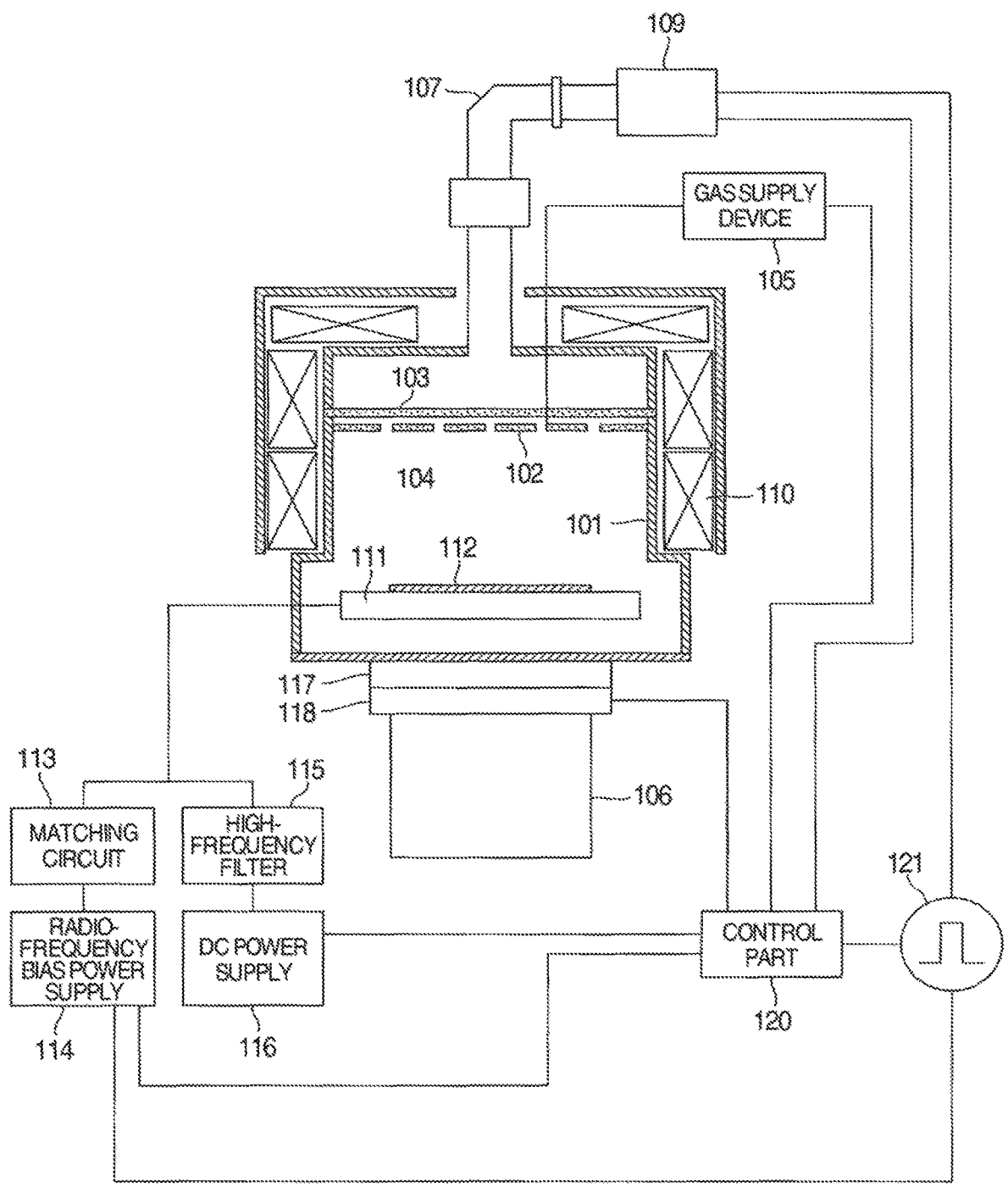
FIG. 5 is a longitudinal sectional view schematically illustrating a microwave ECR plasma etching apparatus according to the present invention.

Embodiments for implementing the present invention are now described with reference to the accompanying drawings. FIG. 5 schematically illustrates a longitudinal section of a microwave plasma etching apparatus of an ECR scheme according to an embodiment of the present invention. At the upper part of a vacuum chamber 101 having the opened top, a shower plate 102 made of quartz for introducing etching gas into the vacuum chamber 101 and a dielectric window 103 made of quartz are disposed and a processing chamber 104 is formed by hermetically sealing them.

To the shower plate 102, a gas supply device 105 for causing the etching gas to flow is connected. Further, a vacuum evacuation device 106 is connected to the vacuum chamber 101 via an on-off valve for evacuation 117 and a variable evacuation speed valve 118. The inside of the processing chamber 104 is decompressed by making the on-off valve for evacuation 117 open and driving the vacuum evacuation device 106 and brought into the vacuum state. The pressure in the processing chamber 104 is adjusted to a desired pressure by means of the variable evacuation speed valve 118.

The etching gas is introduced from the gas supply device 105 through the shower plate 102 into the processing chamber 104 and is exhausted through the variable evacuation speed valve 118 by the vacuum evacuation device 106. Further, a sample mounting electrode 111 which is a sample stage is provided in a lower part of the vacuum chamber 101 opposite to the shower plate 102. A waveguide 107 which transmits electromagnetic waves is disposed above the dielectric window 103 in order to transmit electric power for generating plasma to the processing chamber 104. The electromagnetic waves transmitted to the waveguide 107 are oscillated from a radio-frequency power supply for electromagnetic wave generation 109, which is a first radio-frequency power supply.

Figure 1:
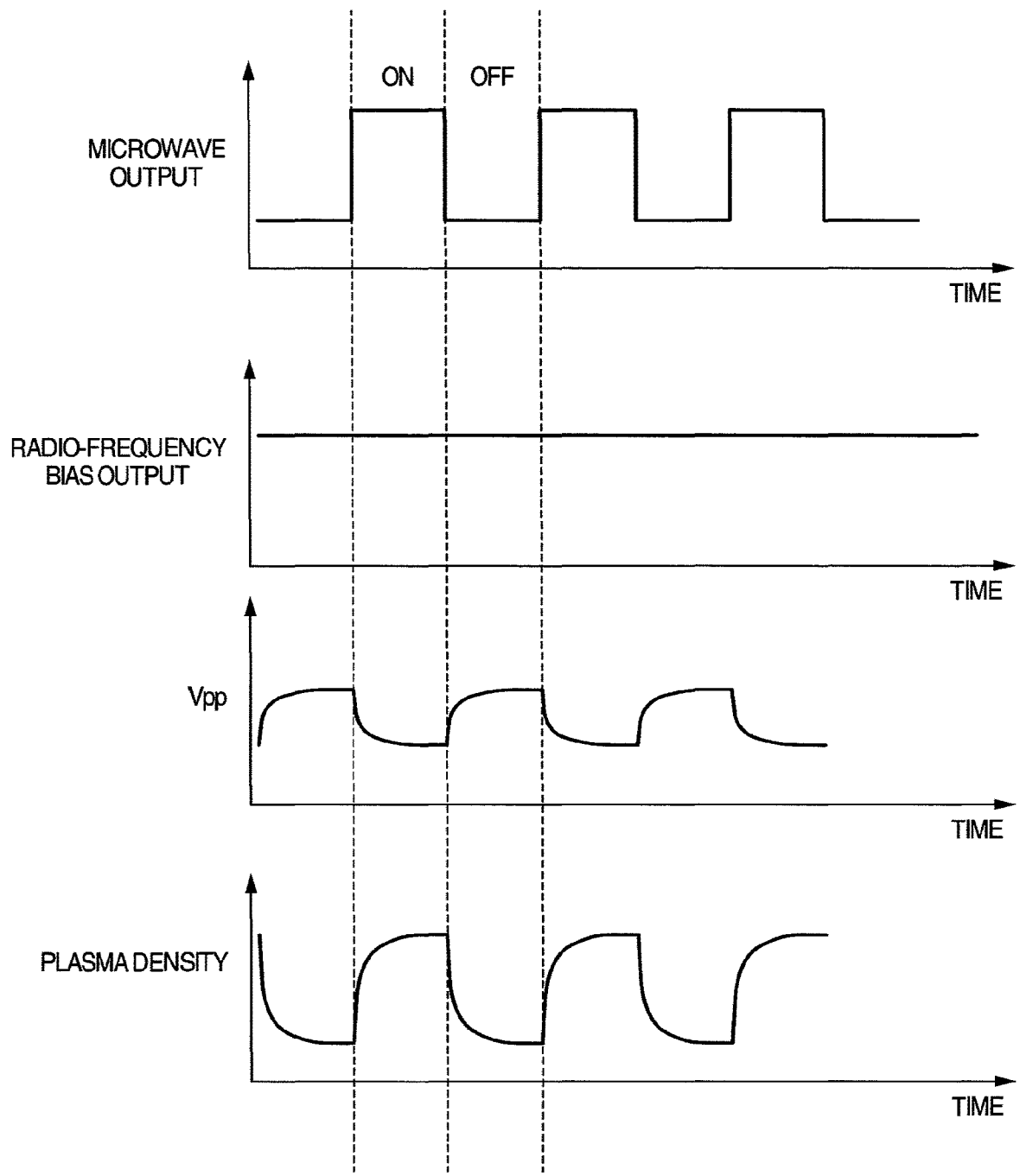
FIG. 1 shows an example in which a radio-frequency bias of a continuous wave is applied to pulsed plasma.
Figure 2:
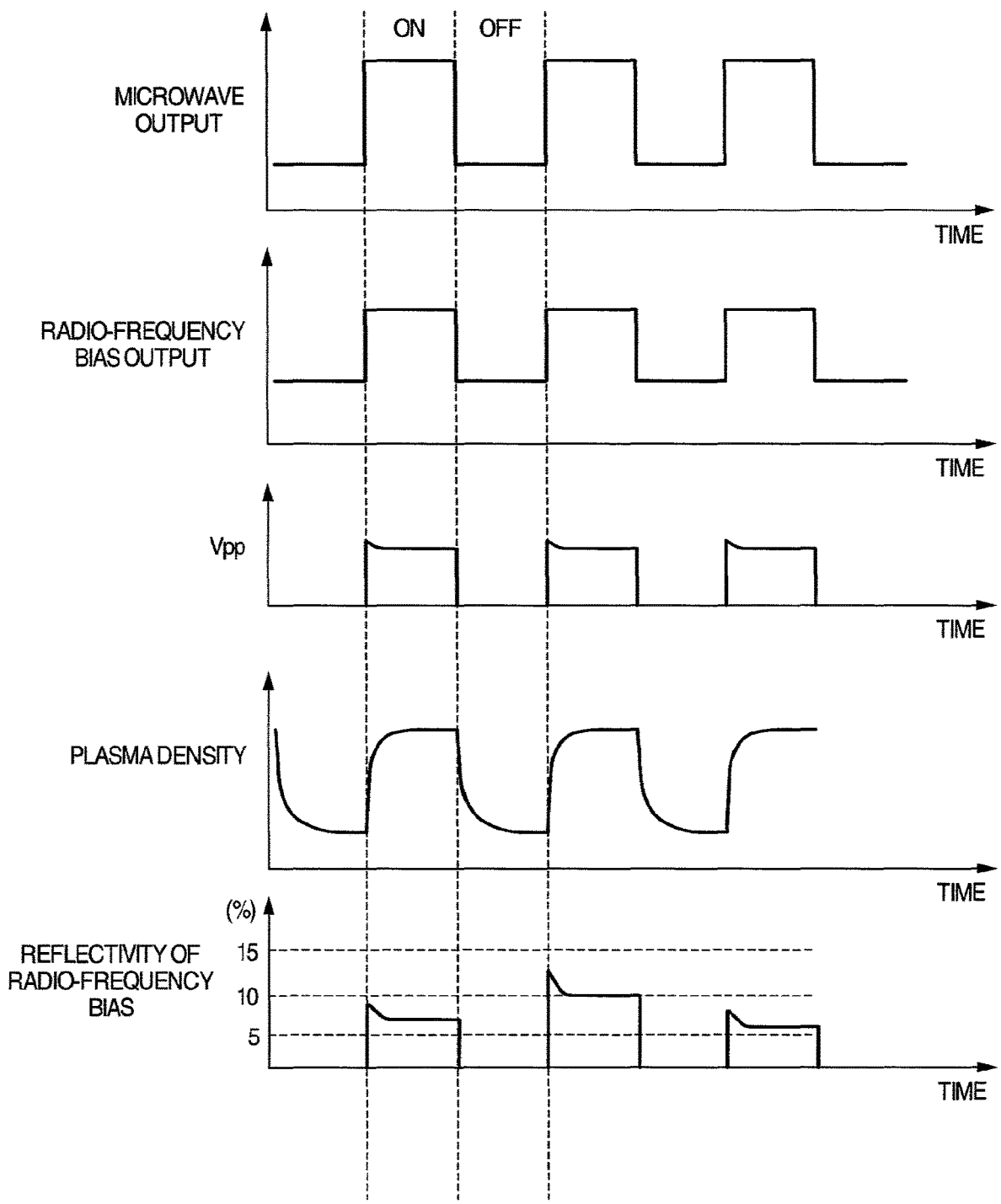
FIG. 2 shows an example in which a time-modulated radio-frequency bias is applied to pulsed plasma.

A pulse generation unit 121 is attached to the radio-frequency power supply for electromagnetic wave generation 109, so that the microwave can be modulated into a form of pulses at a repetition frequency that can be arbitrarily set as shown in FIG. 2. Incidentally, although the effects of the present embodiment are not particularly limited to the frequency of the electromagnetic waves, in the present embodiment a microwave of 2.45 GHz is used. A magnetic-field generating coil 110, which forms a magnetic field, is provided outside of the processing chamber 104 and the electromagnetic waves oscillated from the radio-frequency power supply for electromagnetic wave generation 109 generate high-density plasma in the processing chamber 104 by interaction with the magnetic field formed by the magnetic-field generating coil 110 to perform etching processing on a wafer 112, which is a sample, disposed on the sample mounting electrode 111.

Since the shower plate 102, the sample mounting electrode 111, the magnetic-field generating coil 110, the on-off valve for evacuation 117, the variable evacuation speed valve 118, and the wafer 112 are disposed coaxially with respect to the center axis of the processing chamber 104, the etching gas, radicals and ions generated by plasma, and reaction products produced by etching are introduced and exhausted coaxially with respect to the wafer 112. This coaxial disposition has effects of making uniformities of the etching rate and the etching profile in the wafer plane to an axial symmetry and improving the uniformity of wafer processing.

The sample mounting electrode 111 has the electrode surface covered with ceramic (not shown) and a DC power supply 116 is connected thereto via a radio-frequency filter 115. Further, a radio-frequency bias power supply 114, which is a second radio-frequency power supply, is connected via a matching circuit 113 to the sample mounting electrode 111. To the radio-frequency bias power supply 114, the pulse generation unit 121 is connected and radio-frequency electric power which is time-modulated similarly as shown in FIG. 2 can be supplied to the sample mounting electrode 111 selectively. Incidentally, although the effects of the present embodiment are not particularly limited to the frequency of the radio-frequency bias, in the present embodiment a radio-frequency wave of 400 kHz is used.

A control part 120 which controls the etching processing using the above-described ECR microwave plasma etching apparatus controls repetition frequencies and duty ratios including on- and off-timings of pulses of the radio-frequency power supply for electromagnetic wave generation 109, the radio-frequency bias power supply 114, and the pulse generation unit 121, and etching parameters such as a gas flow rate, processing pressure, electromagnetic wave power, radio-frequency bias power, a coil current, and on- and off-times of pulses for performing etching by means of input means (not shown). Incidentally, the duty ratio is a ratio of the on-period to one period of a pulse. Furthermore, in the present embodiment, the repetition frequencies of the pulses can be changed from 5 Hz to 10 kHz and the duty ratios can be changed from 1% to 90%. Moreover, setting of time modulation can be made by either on- or off-time.

Figure 6:
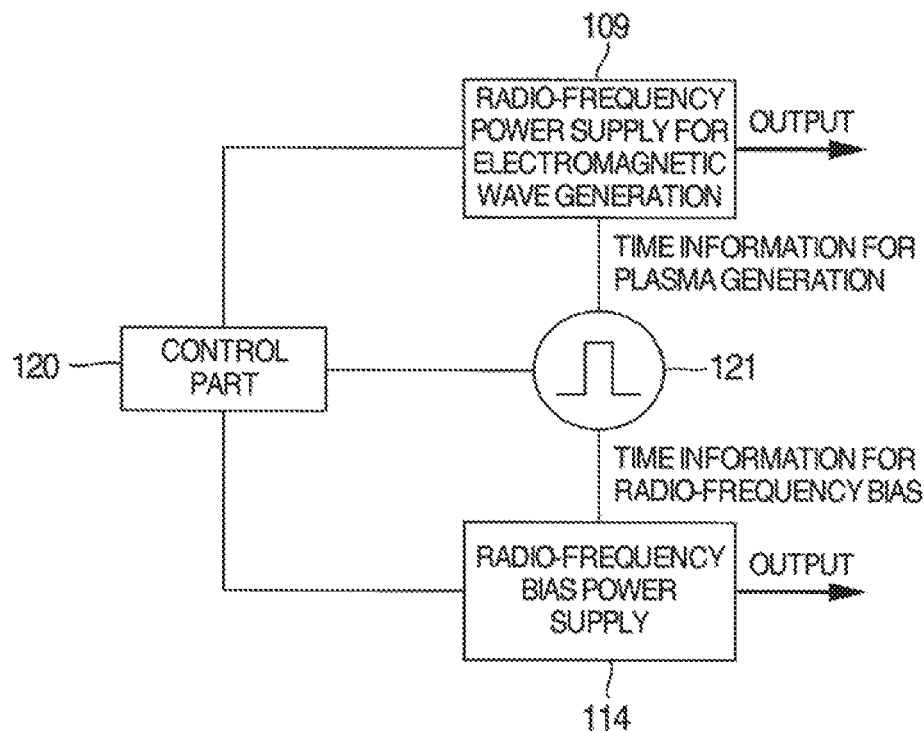
FIG. 6 is a diagram illustrating operation of a control part 120.

Hereinafter, the function of the control part 120 is described with reference to FIG. 6 in the case where time-modulated electromagnetic waves are generated from the radio-frequency power supply for electromagnetic wave generation 109 and in the case where time-modulated radio-frequency power is supplied from the radio-frequency bias power supply 114 to the sample mounting electrode 111. The control part 120 sets the repetition frequencies and the duty ratios for modulating the radio-frequency power supply for electromagnetic wave generation 109 and the radio-frequency bias power supply 114 into forms of pulses, and time information for matching on-moments of the radio-frequency power supply for electromagnetic wave generation 109 with on-moments of the radio-frequency bias power supply 114 in the pulse generation unit 121.

Time information for control for output pulsing of the electromagnetic wave generation power supply is transmitted from the pulse generation unit 121 and time-controlled electromagnetic waves are generated. Similarly, the radio-frequency bias power supply 114 also generates radio-frequency bias output which is time-controlled based on the information transmitted from the pulse generation unit 121.

Figure 15:
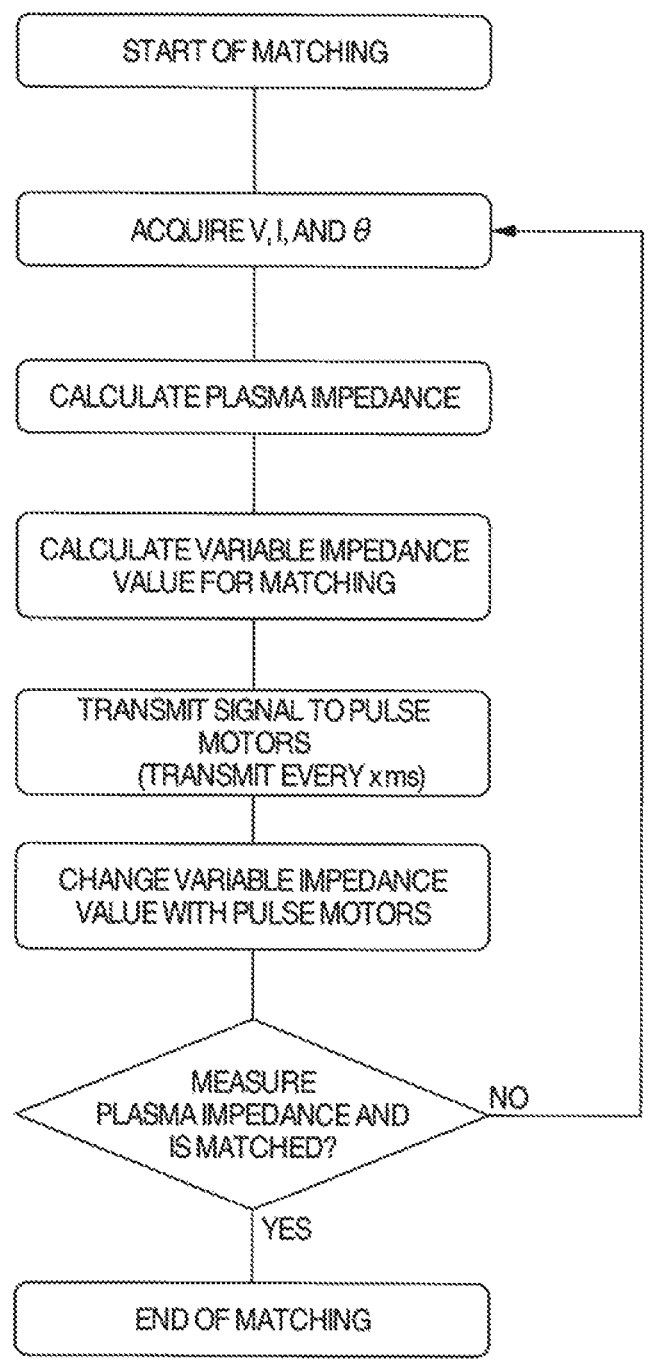
FIG. 15 is a flow chart showing operation of the matching box of the radio-frequency bias.

When the radio-frequency bias is applied, the matching box 113 matches radio-frequency bias according to the flow as shown in FIG. 15 and reduces reflected power. As a matching method, a current, a voltage, and a phase are measured at the matching circuit. Impedance of plasma is calculated from the measured values and variable capacitances in the matching circuit are adjusted to obtain optimum circuit constants. Incidentally, the cycle in which the matching circuit acquires the measured values of plasma impedance and changes variable capacitances based on the measured values of the impedance acquired to perform matching operation is defined as a sampling cycle.

The sampling period can be changed by setting. Since in the present embodiment, capacity values of the variable capacitances are controlled by pulse motors, even if the sampling period is set to be shorter than the minimum time that the pulse motors can be operated, the pulse motors cannot operate. Therefore, the sampling period is generally set to be longer than the operable minimum time of the pulse motors. As an example, description is made to the case where the pulse frequency of the radio-frequency bias is 100 Hz, the duty ratio is 50%, and the sampling period is 12 ms.

Figure 3:
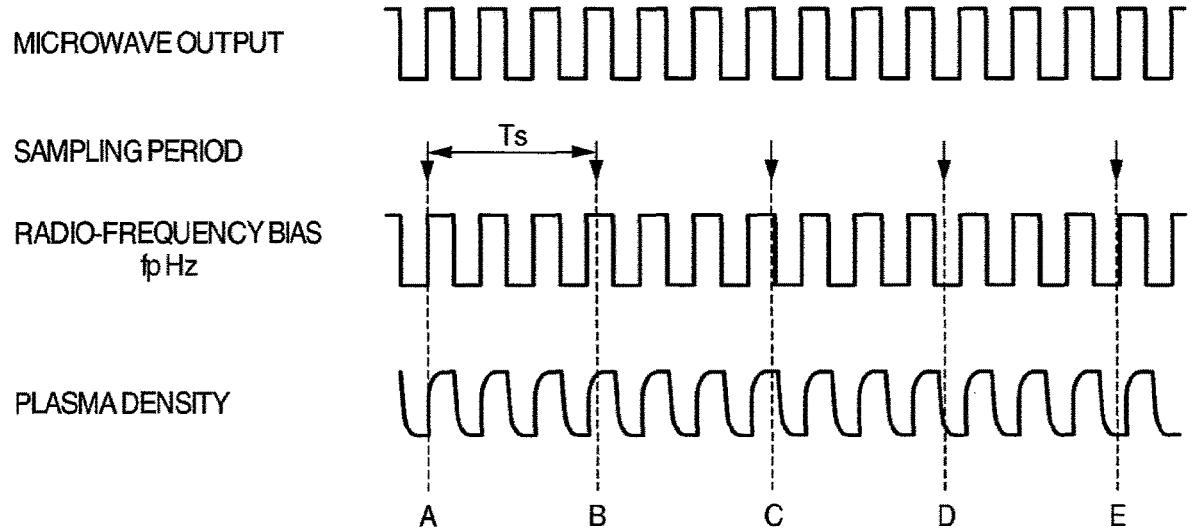
FIG. 3 is a diagram showing sampling timings of a matching box for a radio-frequency bias.
Figure 4:
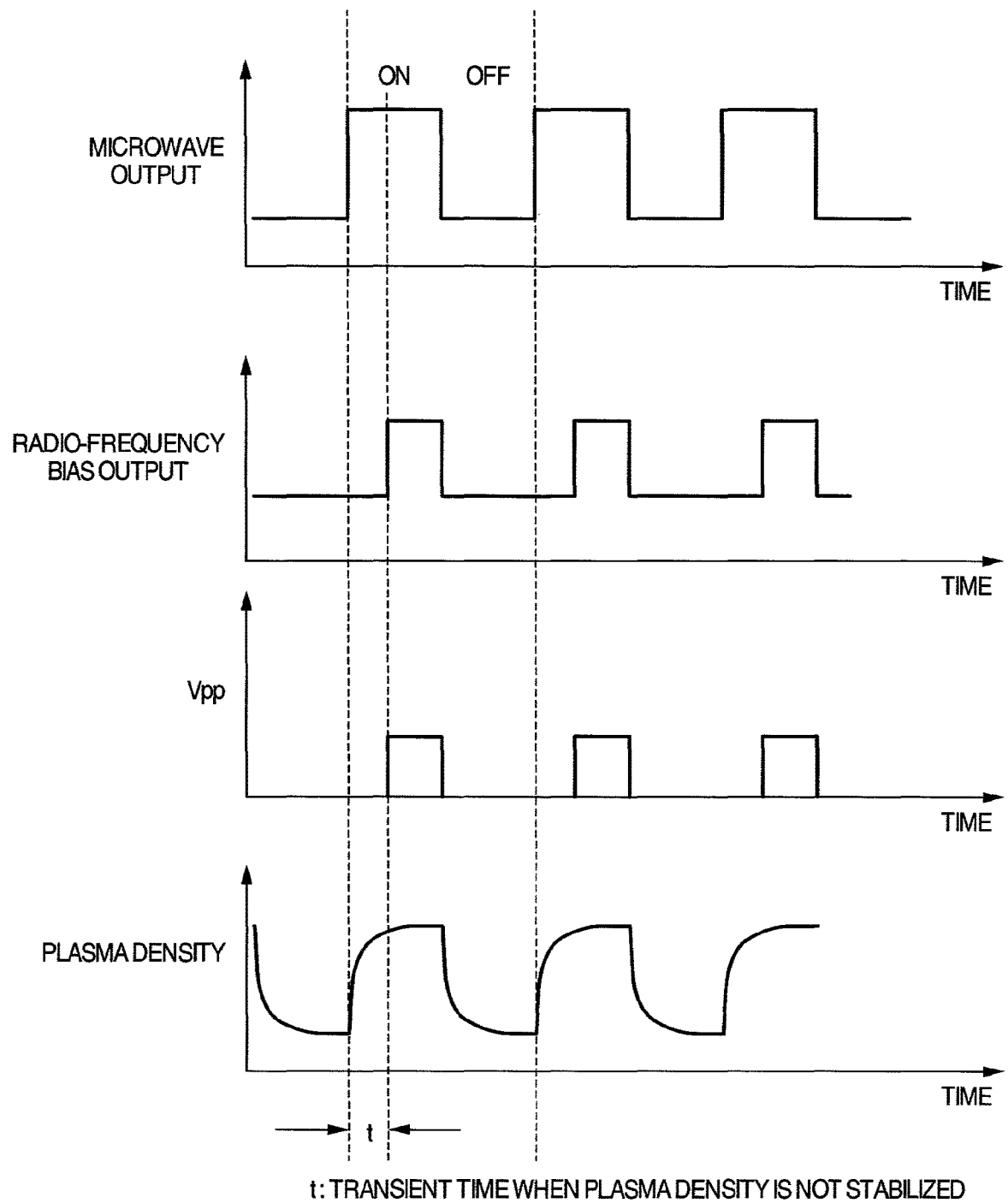
FIG. 4 is a diagram showing a transient time in which plasma density is not stabilized.

It is supposed that the sampling is performed without prescribing the start timing of the sampling. Then, there is a case where the timing that the sampling is performed comes within the off-period as the moments D and E shown in FIG. 3. Since the radio-frequency bias is not applied during the off-period, the voltage cannot be measured and the plasma impedance as viewed from the radio-frequency bias cannot be calculated in the matching circuit; then, the plasma impedance value necessary for the matching operation cannot be obtained to thereby arise the state that matching cannot be made. This problem can be avoided by the method shown below called the sample-hold scheme.

Figure 7:
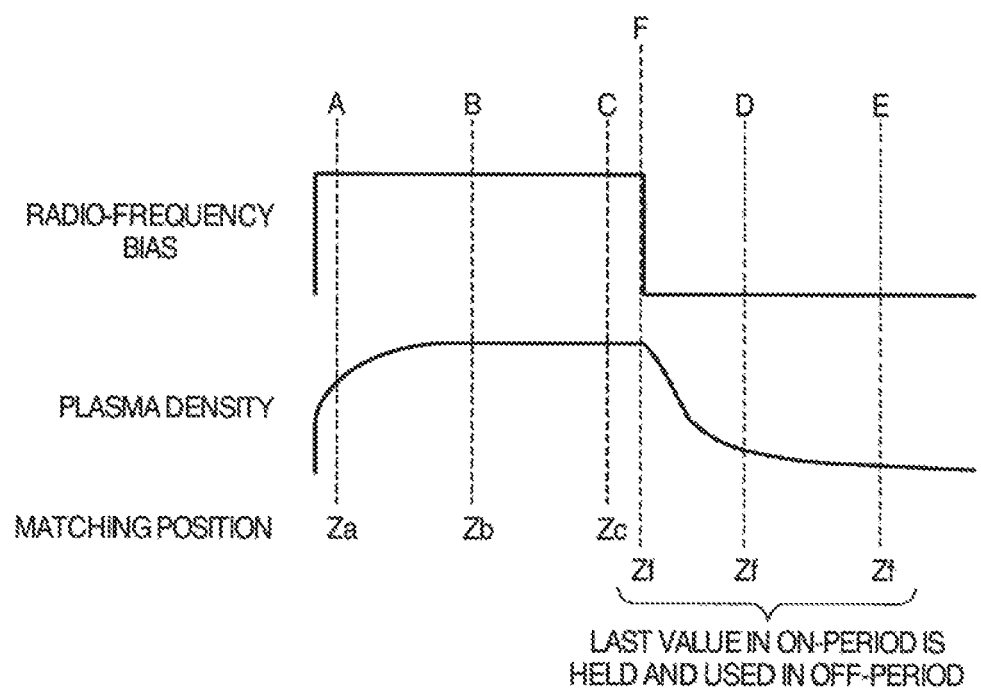
FIG. 7 is a diagram illustrating a sample-hold scheme.
Figure 8:
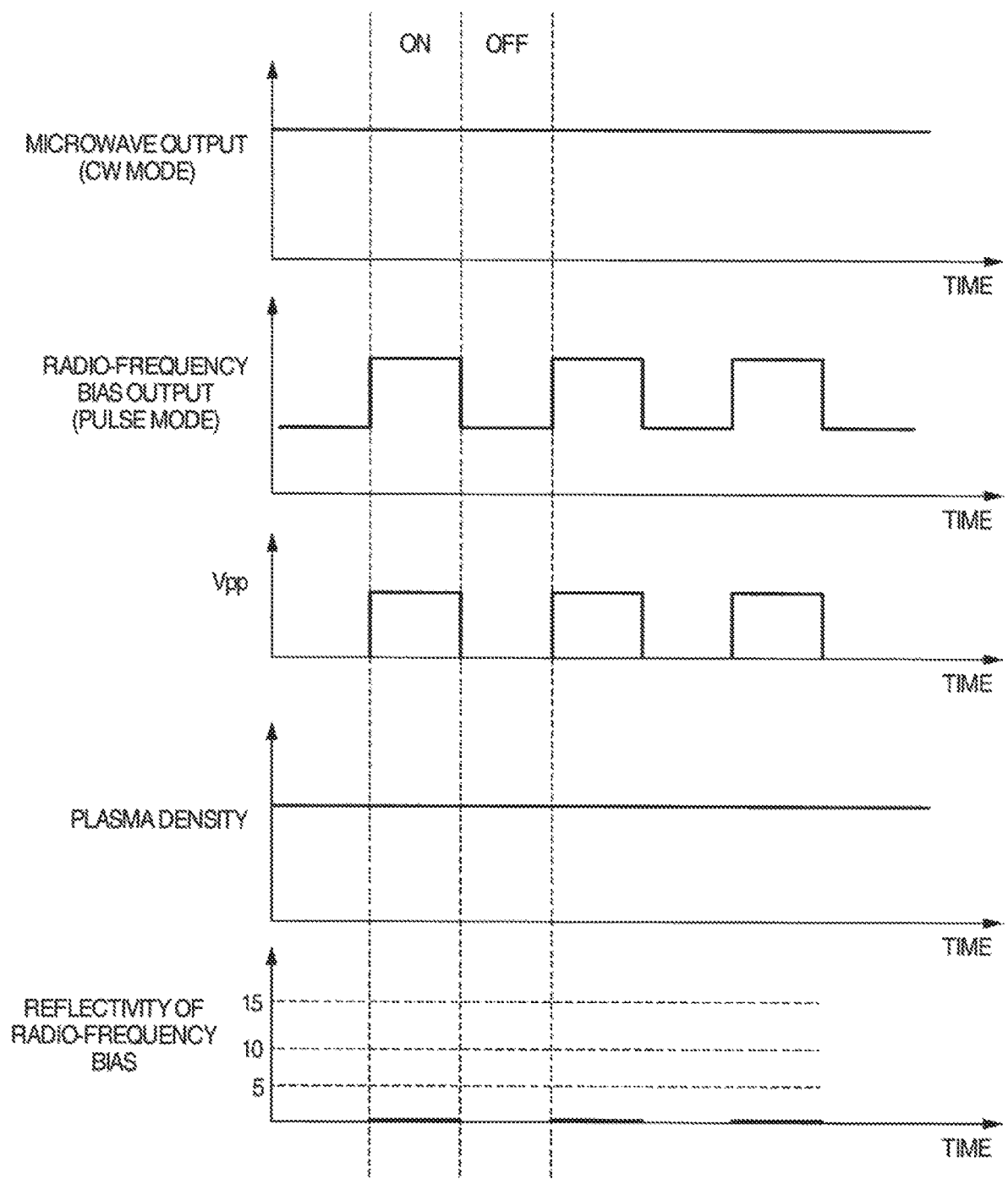
FIG. 8 shows an example in which a time-modulated radio-frequency bias is applied to continuous-wave output plasma.

When the timing of the sampling period comes during the on-period, that is, when the moment is as shown by A, B, or C of FIG. 7, the plasma impedances at respective moments are used as matching indices. Incidentally, the moments of A, B, and C are the same as the moments of A, B, and C of FIG. 3. However, when the sampling timings come during off-period such as the moments of D and E of FIG. 7, the plasma impedance at a certain time during an on-period is adopted to substitute. Incidentally, the moments of D and E here are the same as the moments of D and E of FIG. 3.

Further, in the present embodiment, the plasma impedance at the moment just before the end of the on-period, that is, at the moment F of FIG. 7 is calculated and the value is held until the start timing of the next on-period. Namely, as shown in FIG. 7, the processing that the plasma impedance is supposed to be equal at the off-period to that at a certain moment during the on-period is performed. In this manner, the sample-hold scheme can prevent an abnormal value from being acquired as a plasma impedance during the off-period. The matching box 113 can set any start timing to hold the sampling. Further, the matching box 113 has the function of such the sample-hold scheme.

Next, the algorithm of the matching box 113 for reducing influence on the matching operation during the transient time until stabilization of the plasma density is described. This algorithm is an algorithm with which information concerning the plasma impedance during a certain time from the beginning of the on-period is not acquired. As an example, description is made to the case where a plasma generation frequency of pulsed plasma is 100 Hz, the duty ratio is 50%, and the sampling period is 12 ms. Further, in the present embodiment, the definition of the transient time until stabilization of the plasma density is described with reference to FIG. 9.

Figure 9:
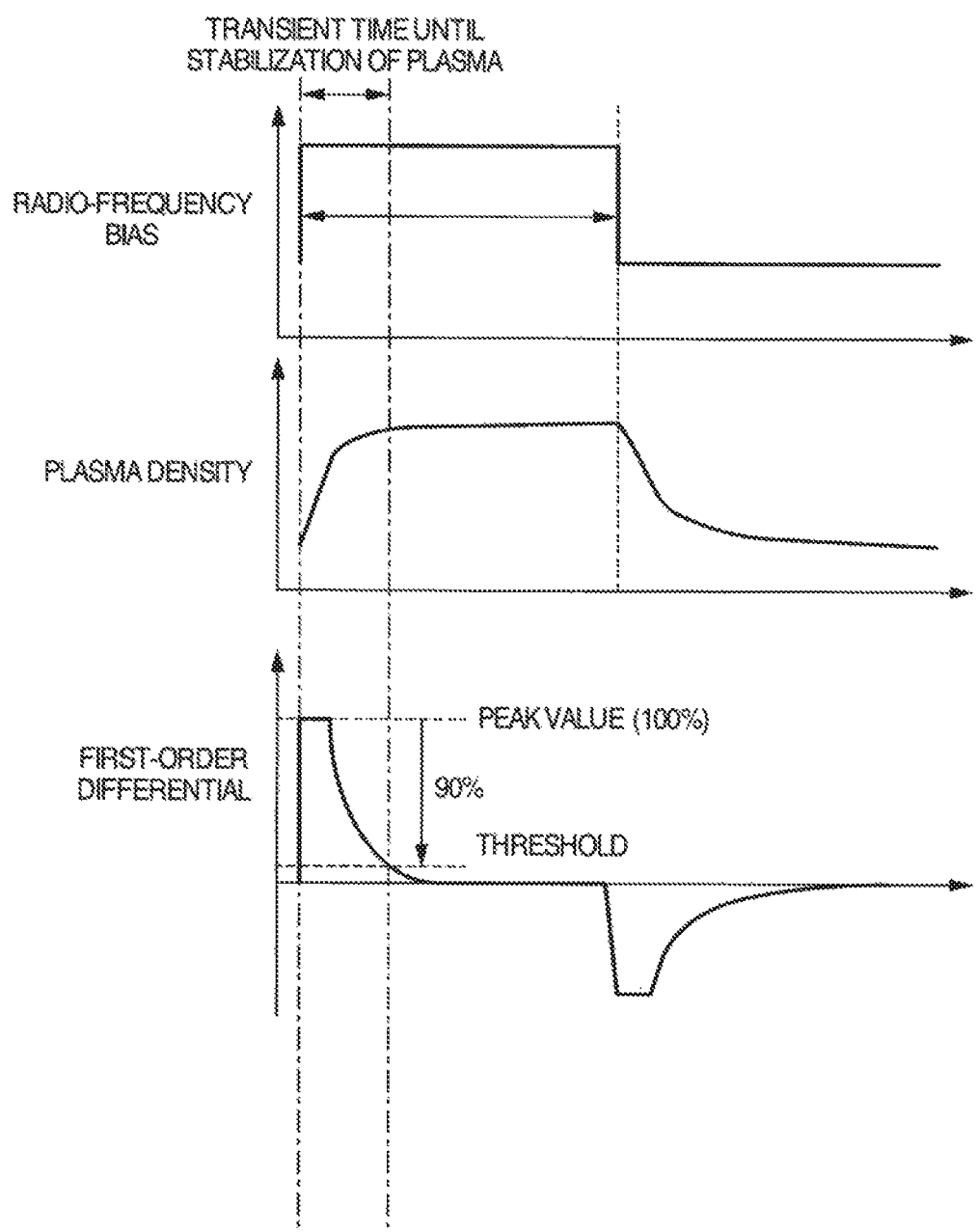
FIG. 9 is a diagram showing a method of prescribing a transient time until stabilization of plasma by plasma density.

The first-order differential of time variation of the plasma density is obtained. When the plasma density does not change and is stable as shown in FIG. 9, the first-order differential value is 0. Since there is also a case where the density continues to slightly change slowly depending on conditions, a judgment criterion for the transient time until stabilization is supposed not to be the first-order differential value=0. In the present embodiment, when the first-order differential value is reduced to 10% or less with respect to a peak value of the first-order differential, it is judged that the transient time until stabilization ends and the stable period starts.

Figure 10:
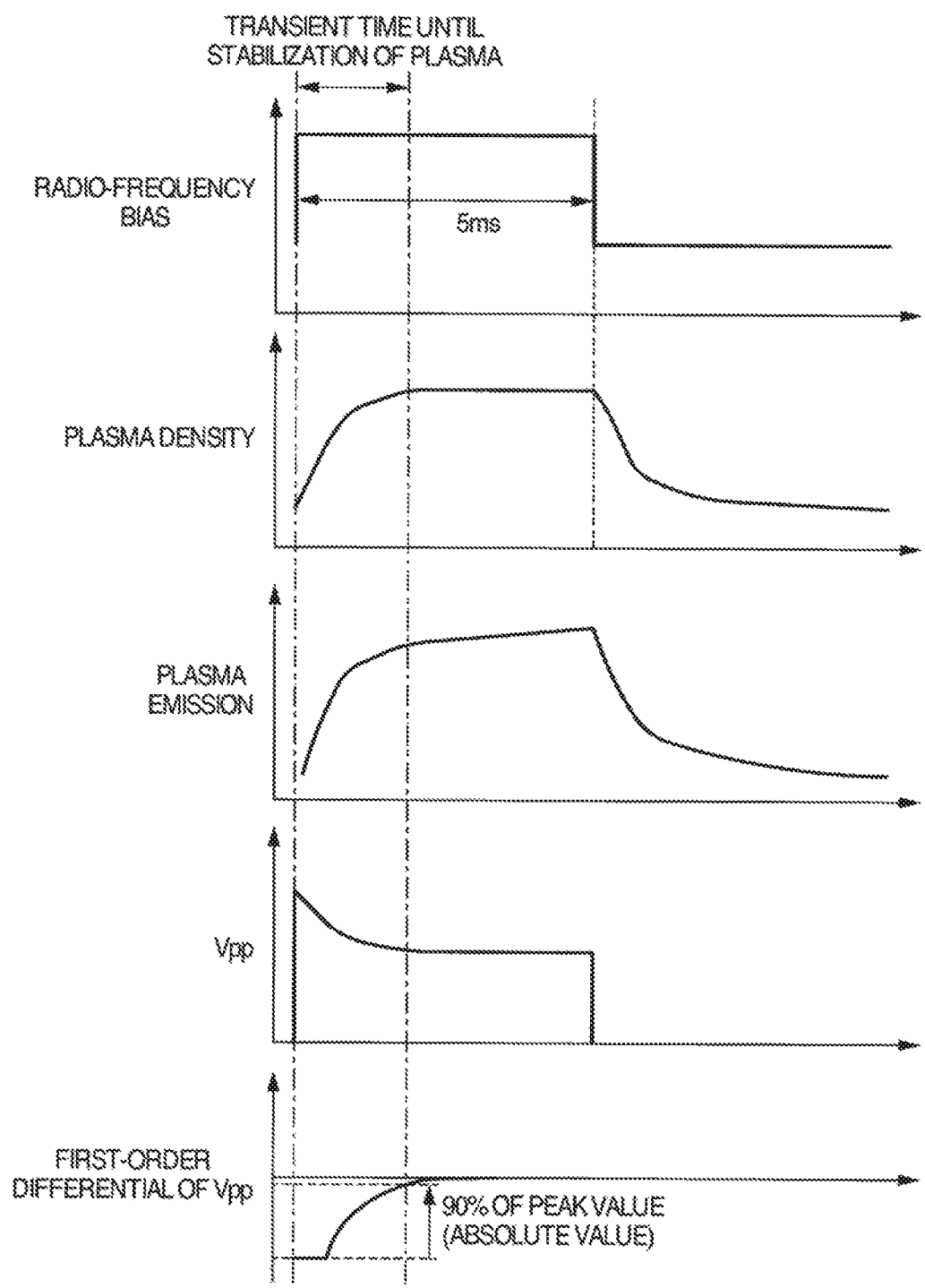
FIG. 10 is a diagram showing the relations of plasma density, plasma emission, and Vpp.

Although in the present embodiment, the threshold of judgment is set to 10% of the peak value, the threshold may be changed depending on conditions. The transient time until the plasma density of the pulse plasma is stabilized is generally about 1 µs to 100 ms, although it is different depending on conditions. As the method of estimating the transient time until the plasma density is stabilized in the pulse plasma, a method of measuring change in Vpp which is a peak-to-peak value of the radio-frequency bias or plasma emission may be used. FIG. 10 shows changes in the plasma density, the plasma emission, and Vpp.

It is necessary that electrons having energies collide with particles so that energies corresponding to emission of light are given to the particles in order to make particles in plasma emit light. The particles to which energies are given emit the energies as light. Since, when the plasma density changes, the density of electrons having energies also changes similarly, there is a correlation between change in emission of light from plasma and change in the plasma density. Hence, the time until the plasma density is stabilized can be substituted by the time until light emission from plasma is stabilized.

Further, when the plasma density changes, Vpp as viewed from the radio-frequency bias changes. This is because the impedance as viewed from the radio-frequency bias changes by the plasma density. Accordingly, the change in Vpp also has a correlation with the change in the plasma density. There is also a method of directly observing the change in the plasma density by means of a Langmuir probe or the like. When it is necessary to install a Langmuir probe or the like in a vacuum processing chamber (hereinafter, referred to as a chamber), hardware configuration becomes complex.

Further, since it is necessary to install it inside the chamber, there is a possibility that the plasma is influenced. Measurements of Vpp and plasma emission do not require detection means to be installed in the chamber and influence on plasma is small. In the present embodiment, change in Vpp is measured by the method of using the first-order differential similarly to judgment of the transient time until stabilization of the plasma density described above. As shown in FIG. 10, the time when an absolute value of the first-order differential reaches 10% with respect to an absolute value of the peak value of the first-order differential of Vpp is defined as the time when the plasma density stabilizes.

Figure 11A:
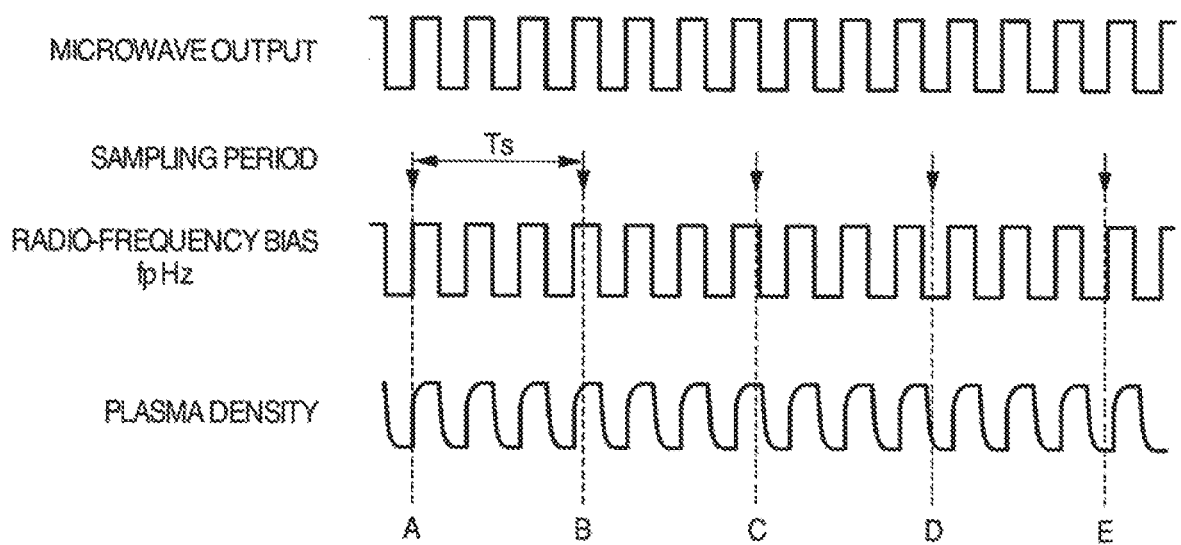
FIGS. 11A and 11B are diagrams showing matching of a radio-frequency bias according to the present invention.
Figure 11B:
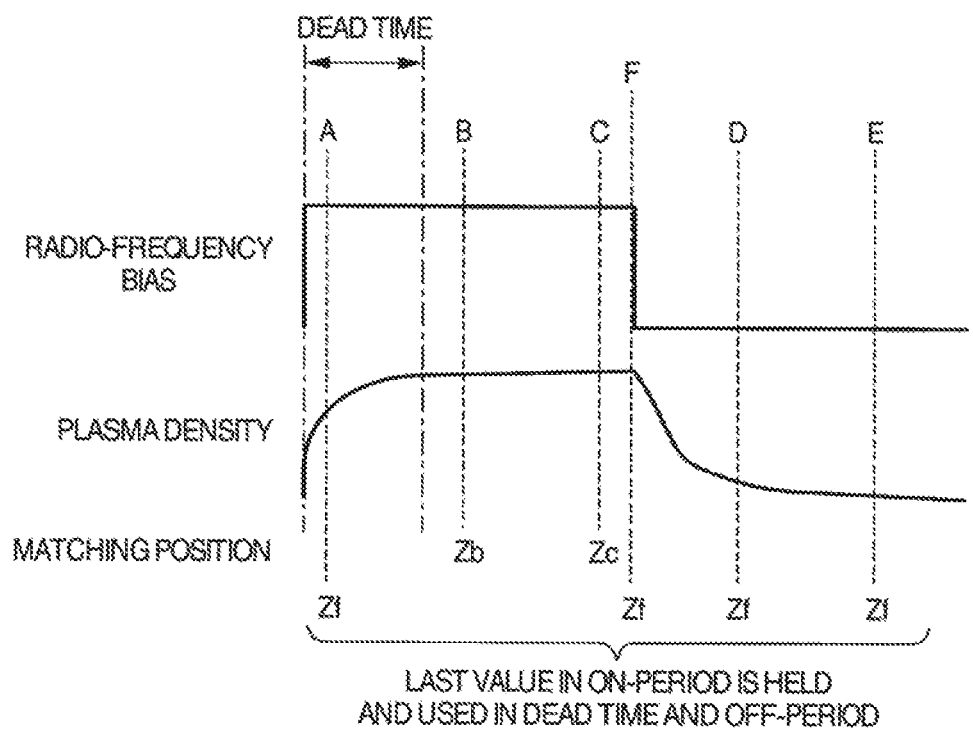

From this method, the time until which the plasma density is stabilized is estimated to be about 2 ms or less and only the plasma impedance values after 2 ms from the beginning of the on-state of the radio-frequency bias are adopted to be acquired. The period that the plasma impedance information is not acquired from the beginning of the on-state of the radio-frequency bias is, hereinafter, referred to as a dead time. As shown in FIGS. 11A and 11B, when the timings of the sampling period of the matching box 113 are within the dead time, the value at the end of the on-period used in the sample-hold is adopted to be used. While in the case of the conventional method in which the dead time is not used, as shown in FIG. 2, the result was that the reflection value of the radio-frequency bias exceeded 5% in the reflectivity and dispersion of the reflection value was large, by performing matching using the dead time of the present invention, the radio-frequency bias can be applied with the reflection being small and stably to thereby reduce the reflectivity to be smaller than or equal to 1%.

In the present embodiment, the dead time is set with reference to the start time of the on-state of the radio-frequency bias; the moment of on-state of plasma may, however, be used as a reference. Further, as described above, since on- and off-moments of plasma can be measured by monitoring the light emission of plasma, the method of acquiring information of the plasma impedance after the elapse of the dead time from the on-moment of the emission of plasma may be adopted.

This method is effective when a delay time exists between on and off of the radio-frequency power supply for plasma generation and on and off of plasma. A method of monitoring not only emission of plasma but also another parameter associated with on and off of pulsed plasma, for example, Vpp described above and using it as reference of the dead time may be adopted. It is a method in which the dead time is set after the moment that Vpp is stabilized.

Usually, the pulsed plasma scheme has a hardware configuration in which a time-modulation frequency (hereinafter, referred to as a pulse frequency) of the radio frequency for plasma generation and/or the duty ratio can be changed. This is because control of the pulse frequency and/or the duty ratio is effective in controlling the etching performance. In case of the method of providing the dead time based on the start moment of on-state of the radio-frequency bias as described above, a sampling effective time varies by changing the duty radio and/or the pulse frequency as shown in cases 1 to 3 of FIG. 12. Here, the sampling effective time is the period when the measured values of plasma impedance can be acquired.

Further, the stabilization time of the plasma density may vary greatly by changing the duty ratio and/or the pulse frequency depending on the etching conditions and/or the state of plasma. In this case, the set dead time may become shorter than the stabilization time of the plasma density depending on the etching conditions. In the case 1, the matching has no problem; in the cases 2 and 3, however, there arises a problem that reflection becomes large or the reflection value is not stable. Accordingly, the set value of the dead time must be changed depending on the etching conditions and, when the etching conditions comprise plural steps, setting of the dead time and/or countermeasures with software become complex.

Figure 13A:
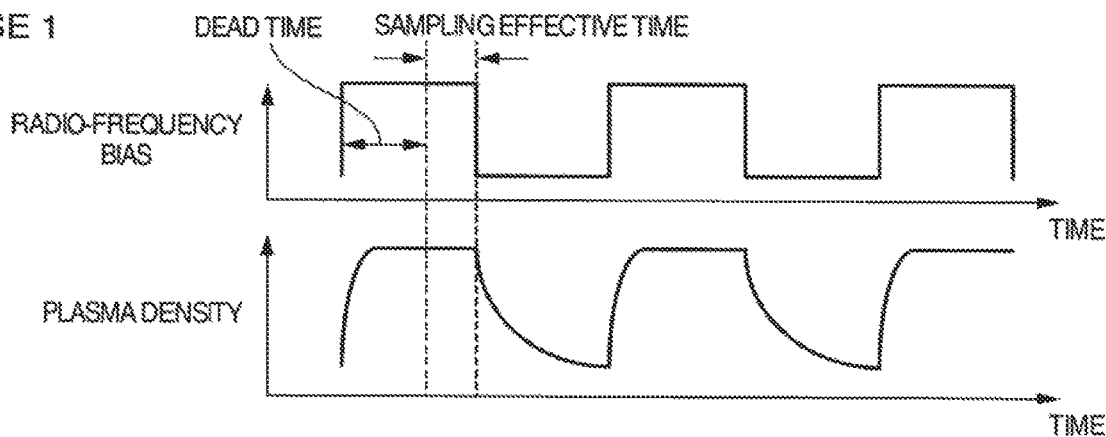
FIGS. 13A, 13B, and 13C are diagrams showing cases 1 to 3 when a sampling effective time is fixed.
Figure 13B:
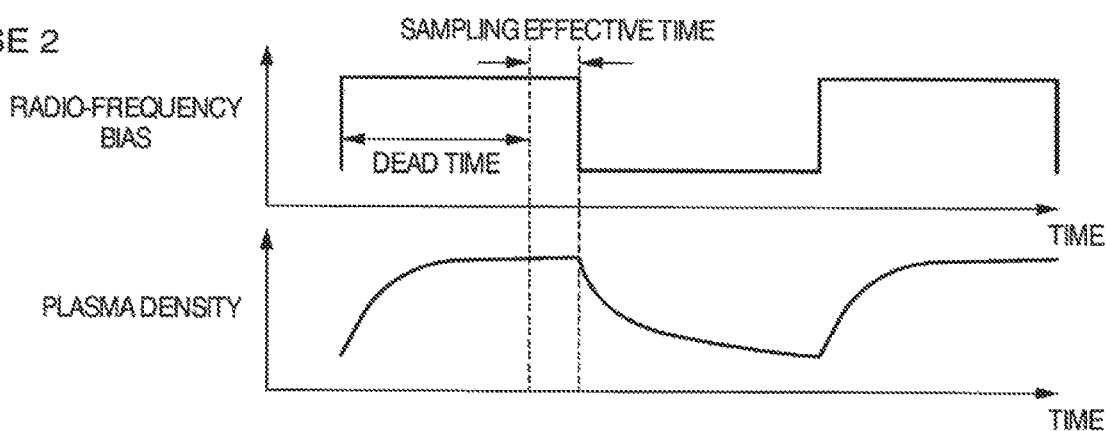
Figure 13C:
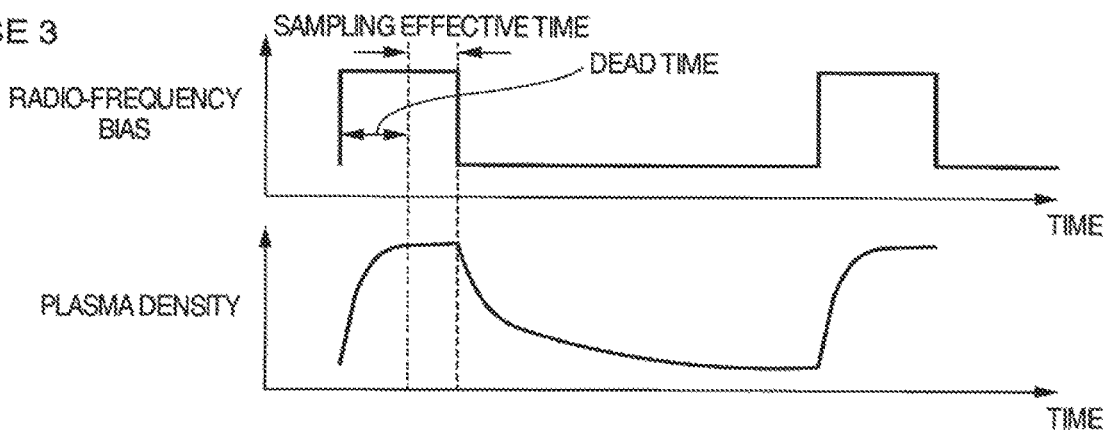

In order to solve this problem, a method is effective in which the sampling effective time of the matching box 113 is fixed as shown in FIGS. 13A, 13B, and 13C so that the measured value of the plasma impedance is acquired only during the fixed period before the end of the on-period of the radio-frequency bias and the sample-hold value is used during the other time. This method is described below.

The dead time is set so that the sampling effective time of the matching box 113 is fixed with the moment of turning off the radio-frequency bias as a reference. First, the on-period of the radio-frequency bias is obtained from the pulse frequency and the duty ratio of the radio-frequency bias. Next, a value obtained by subtracting the sampling effective time of the matching box 113 from the on-period of the radio-frequency bias is set to be the dead time. With such a calculation method of the dead time, the sampling effective time of the matching box 113 can be fixed independent of the pulse frequency, the duty ratio, and the like of the radio-frequency bias. Incidentally, the sampling effective time of the matching box 113 is a desired value obtained in advance. Furthermore, with the exception of the sampling effective time of the matching box 113, the measured value of the plasma impedance acquired at the last of the sampling effective time of the matching box 113 is used to conduct matching without acquiring a measured value of the plasma impedance, that is, the above-mentioned sample-hold state is established.

Further, since the radio-frequency bias is often applied to overlap the period of the stable plasma density, the plasma density is usually more stable just before the moment of turning off the radio-frequency bias than just after the moment of turning on the radio-frequency bias. Accordingly, there are cases where the method of setting the sampling effective time of the matching box 113 based on the moment of turning off the radio-frequency bias is effective. Next, referring to FIG. 14, measures of suppressing scattering of the reflection value of the radio-frequency bias in case of pulsed discharge without using the sample-hold function are described.

Figure 14:
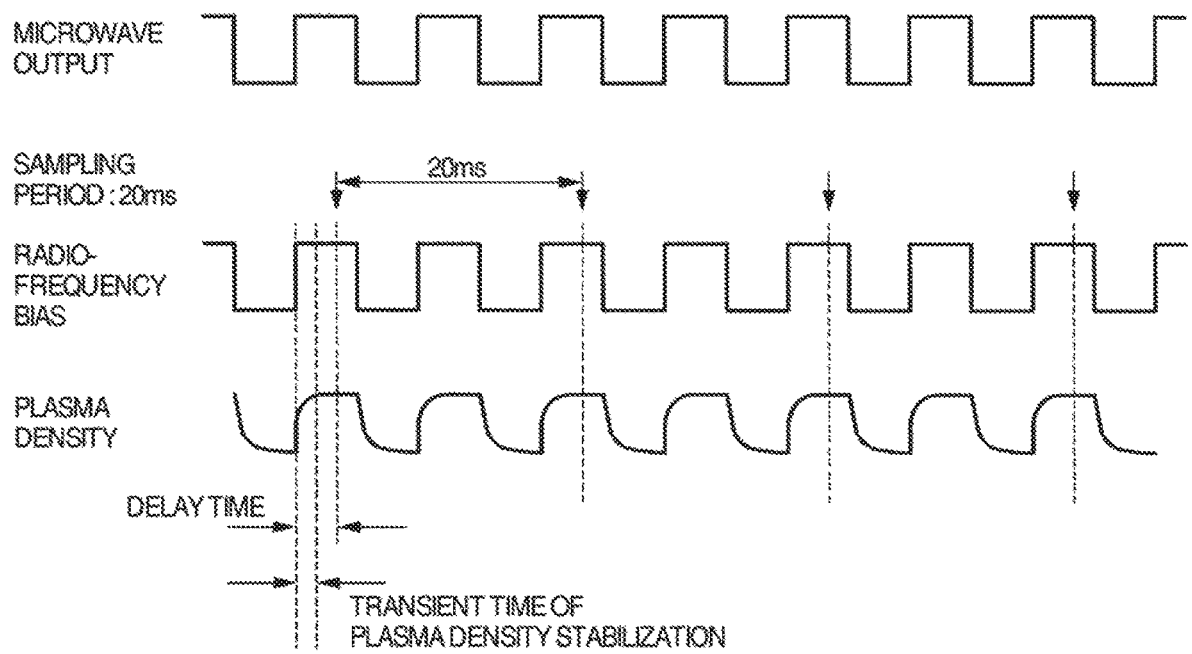
FIG. 14 is a diagram showing the case where a frequency of time modulation of the radio-frequency bias is set to an integral multiple of a sampling frequency of a matching box.

Description is made in case where the radio-frequency bias has the pulse frequency of 100 Hz and the duty ratio of 50%. As shown in FIG. 14, the delay time is set so that the sampling timing of the matching box 113 comes after the transient time until the plasma density is stabilized. Further, the pulse frequency of the radio-frequency bias is set to be an integral multiple of the sampling frequency of the matching box 113. In the example of FIG. 14, the sampling period of the matching box 113 is set to be 20 ms which is twice the period of the pulse of the radio-frequency bias.

By setting the delay time to conduct sampling for the matching box 113 while the plasma density is stable and making the pulse frequency of the radio-frequency bias to be an integral multiple of the sampling frequency of the matching box 113 in this manner, scattering of the reflection value of the radio-frequency bias in case of pulsed discharge can be suppressed without using the sample-hold scheme.

Further, when the period and the duty ratio of pulses of the radio-frequency bias change, by changing the delay time, it is possible that sampling of the matching box 113 won't be conducted during the transient time before stabilizing the plasma density. Furthermore, setting the pulse frequency of the radio-frequency bias to be an integral multiple of the sampling frequency of the matching box 113 may be used even in the means for setting the above-described dead time, without being limited to this case.

After all, the present invention described in the present embodiment stated above is implemented as control of the matching box 113. Alternatively, the matching box 113 implements the present invention described in the present embodiment stated above as an algorithm. Alternatively, the control part 120 may control the matching box 113 so that the present invention described in the present embodiment stated above is implemented.

Further, although in the present embodiment stated above the pulse frequency and the duty ratio of the radio-frequency bias are used as parameters of time control, the on- and off-times and the like may be used. Furthermore, although in the present embodiment stated above, the plasma impedance is used as information for performing matching by the matching circuit, the similar effects can be obtained as far as it is information concerning the matching such as a current, a voltage, and a phase.

Moreover, although in the present embodiment stated above the case where the microwave ECR plasma source is used has been described, the similar effects can be attained even in the plasma processing apparatus of another plasma generation scheme such as a capacitively coupled plasma source and an inductively coupled plasma source.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, comprising:
    a vacuum chamber in which a sample is plasma processed;
    a first radio-frequency power supply which is configured to supply first radio-frequency power for generating plasma in the vacuum chamber;
    a sample stage disposed in the vacuum chamber on which the sample is mounted;
    a second radio-frequency power supply which is configured to supply second radio-frequency power to the sample stage;
    a matching box which is configured to perform matching for suppressing reflection of the second radio-frequency power; and
    a controller configured to cause the matching box, when the first radio-frequency power and the second radio-frequency power are time-modulated, to acquire information used for performing the matching during a sampling effective period which begins after elapse of a prescribed time and ends at an end of an on-state of the time-modulated second radio-frequency power, the prescribed time starting from a beginning of the on-state of the time-modulated second radio-frequency power,
    wherein the information used for performing the matching is not acquired during the prescribed time, and
    wherein the controller is configured to cause the matching box to perform the matching from after an end of the sampling effective period until a next sampling effective period based on the information acquired during the sampling effective period.

2. The plasma processing apparatus according to claim 1, wherein the prescribed time is obtained based on a density of the plasma generated with the time-modulated first radio-frequency power.

3. The plasma processing apparatus according to claim 1, wherein the sampling effective period is obtained based on a frequency of time-modulation of the second radio-frequency power, a duty ratio of time-modulation of the second radio-frequency power, and the prescribed time.

4. The plasma processing apparatus according to claim 1, wherein the prescribed time is obtained based on a time required to stabilize a peak-to-peak value of a voltage of the second radio-frequency power.

5. The plasma processing apparatus according to claim 1, wherein the prescribed time is obtained based on a time required to stabilize an emission intensity of the plasma.

6. The plasma processing apparatus according to claim 3, wherein the frequency is an integral multiple of an inverse of a period of performing the matching.

7. A plasma processing apparatus, comprising:
    a vacuum chamber in which a sample is plasma processed;
    a first radio-frequency power supply which is configured to supply first radio-frequency power for generating plasma in the vacuum chamber;
    a sample stage disposed in the vacuum chamber on which the sample is mounted;
    a second radio-frequency power supply which is configured to supply second radio-frequency power to the sample stage;
    a matching box which is configured to perform matching for suppressing reflection of the second radio-frequency power; and
    a controller configured to cause the matching box, when the first radio-frequency power and the second radio-frequency power are time-modulated, to acquire information used for performing the matching during a sampling effective period which begins after elapse of a prescribed time and ends at an end of an on-state of the time-modulated second radio-frequency power,
    wherein the information used for performing the matching is not acquired during the prescribed time, and
    wherein the controller is configured to cause the matching box to perform the matching from after an end of the sampling effective period until a next sampling effective period based on the information acquired during the sampling effective period.

* * * * *